(12) United States Patent
Inagawa et al.

(10) Patent No.: US 8,642,401 B2
(45) Date of Patent: *Feb. 4, 2014

(54) INSULATED GATE TYPE SEMICONDUCTOR DEVICE AND METHOD FOR FABRICATING THE SAME

(71) Applicants: Renesas Electronics Corporation, Kawasaki (JP); Hitachi Tobu Semiconductor, Ltd., Gunma (JP)

(72) Inventors: Hiroshi Inagawa, Maebashi (JP); Nobuo Machida, Takasakii (JP); Kentaro Oishi, Tamamura (JP)

(73) Assignees: Renesas Electronics Corporation, Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/747,557

(22) Filed: Jan. 23, 2013

(65) Prior Publication Data

US 2013/0137223 A1   May 30, 2013

Related U.S. Application Data

(60) Continuation of application No. 13/396,816, filed on Feb. 15, 2012, now Pat. No. 8,377,775, which is a continuation of application No. 12/962,499, filed on Dec. 7, 2010, now Pat. No. 8,168,498, which is a division of application No. 12/868,698, filed on Aug. 25, 2010, now Pat. No. 7,910,990, which is a continuation of application No. 12/539,383, filed on Aug. 11, 2009, now Pat. No. 7,843,001, which is a continuation of application No. 12/037,139, filed on Feb. 26, 2008, now Pat. No. 7,585,732, which is a continuation of application No. 11/653,404, filed on Jan. 16, 2007, now Pat. No. 7,361,557, which is a continuation of application No. 10/984,788, filed on Nov. 10, 2004, now Pat. No. 7,172,941, which is a division of application No. 10/046,077, filed on Jan. 16, 2002, now Pat. No. 6,858,896.

(30) Foreign Application Priority Data

Feb. 19, 2001   (JP) ................................ 2001-042352

(51) Int. Cl.
    *H01L 21/332*   (2006.01)
(52) U.S. Cl.
    USPC .................................. 438/138; 257/E21.384
(58) Field of Classification Search
    USPC ............ 438/135, 138; 257/E21.384, E21.621
    See application file for complete search history.

(56) References Cited

U.S. PATENT DOCUMENTS

| | | |
|---|---|---|
| 5,378,655 A | 1/1995 | Hutchings et al. |
| 5,387,528 A | 2/1995 | Hutchings et al. |

(Continued)

FOREIGN PATENT DOCUMENTS

| | | |
|---|---|---|
| JP | 03-109775 A | 3/1994 |
| JP | 06-350090 A | 12/1994 |

(Continued)

OTHER PUBLICATIONS

Semiconductor Handbook, 1981, pp. 429-430.

(Continued)

*Primary Examiner* — Chandra Chaudhari
(74) *Attorney, Agent, or Firm* — Miles & Stockbridge P.C.

(57) ABSTRACT

In an insulated-gate type semiconductor device in which a gate-purpose conductive layer is embedded into a trench which is formed in a semiconductor substrate, and a source-purpose conductive layer is provided on a major surface of the semiconductor substrate, a portion of a gate pillar which is constituted by both the gate-purpose conductive layer and a cap insulating film for capping an upper surface of the gate-purpose conductive layer is projected from the major surface of the semiconductor substrate; a side wall spacer is provided on a side wall of the projected portion of the gate pillar; and the source-purpose conductive layer is connected to a contact region of the major surface of the semiconductor substrate, which is defined by the side wall spacer.

6 Claims, 11 Drawing Sheets

(56) References Cited

U.S. PATENT DOCUMENTS

| | | | |
|---|---|---|---|
| 5,396,093 | A | 3/1995 | Lu |
| 5,460,985 | A | 10/1995 | Tokura et al. |
| 5,489,790 | A | 2/1996 | Lage |
| 5,525,821 | A * | 6/1996 | Harada et al. ............ 257/331 |
| 5,648,670 | A | 7/1997 | Blanchard |
| 5,773,851 | A | 6/1998 | Nakamura et al. |
| 5,877,528 | A | 3/1999 | So |
| 6,051,468 | A | 4/2000 | Hshieh |
| 6,084,264 | A | 7/2000 | Darwish |
| 6,087,224 | A | 7/2000 | Luo |
| 6,118,150 | A | 9/2000 | Takahashi |
| 6,168,996 | B1 | 1/2001 | Numazawa et al. |
| 6,188,105 | B1 | 2/2001 | Kocon et al. |
| 6,211,549 | B1 | 4/2001 | Funaki et al. |
| 6,251,730 | B1 | 6/2001 | Luo |
| 6,437,399 | B1 | 8/2002 | Huang |
| 6,465,843 | B1 | 10/2002 | Hirler et al. |
| 6,469,345 | B2 | 10/2002 | Aoki et al. |
| 6,541,817 | B1 | 4/2003 | Hurkx et al. |
| 6,541,818 | B2 | 4/2003 | Pfirsch et al. |
| 6,576,953 | B2 | 6/2003 | Hirler |
| 6,638,850 | B1 | 10/2003 | Inagawa et al. |
| 2001/0009800 | A1 | 7/2001 | Hijzen et al. |
| 2002/0137291 | A1 | 9/2002 | Zandt In't et al. |

FOREIGN PATENT DOCUMENTS

| | | |
|---|---|---|
| JP | 8-23092 | 1/1996 |
| JP | 9-246550 | 9/1997 |
| JP | 2000-196075 A | 7/2000 |
| JP | 2000-277531 | 10/2000 |
| JP | 2003-515954 A | 5/2003 |
| JP | 2004-518292 A | 6/2004 |
| WO | WO 93/03502 | 2/1993 |

OTHER PUBLICATIONS

Wolf, S. et al., Silicon Processing for the VLSI Era, vol. 1, Lattice Press, 1986, p. 384.

* cited by examiner

INSULATED GATE TYPE SEMICONDUCTOR DEVICE AND METHOD FOR FABRICATING THE SAME

BACKGROUND OF THE INVENTION

The present invention is related to a semiconductor device, and more specifically, is directed to a technique capable of being effectively applied to a semiconductor device having a trench-gate structure.

While power transistors are employed in power amplifier circuits, power supply circuits, converters, power protective circuits and the like, since these power transistors may handle high power, both high breakdown voltages and high currents are required. In the case that MISFETs (Metal Insulator Semiconductor Field-Effect Transistors) are used, high-current requirements may be satisfied by increasing channel widths of these MISFETs.

Then, in order to avoid that occupied areas of semiconductor chips are increased by widening such channel widths, for example, mesh-gate structures are employed. In these mesh-gate structures, the gates are arranged in a lattice (grid) shape so as to increase channel widths per unit chip area FETs having such mesh-gate structures are described in, for instance, "SEMICONDUCTOR HANDBOOK" of Pages 429-430 published by OHM-sha Ltd., in 1981.

Conventionally, among these power FETs, such power FETs having planar structures have been employed, since the manufacturing steps thereof are simple and oxide films which constitute gate insulating films can be readily formed. However, when cell sizes are made small in order to lower resistance values of planar FETs, depletion layers of cells located adjacent to each other will extend to contact with each other, so that no current may flow. As a result, even when these planar FETs are tried to be made in very fine manners, resistance values thereof could not be lowered. This is referred to as the "JFET effect." As a consequence, there is a limitation in lowering resistance values of these planar FETs by being made in very fine manners.

Accordingly, under such a reason that integration degrees of semiconductor cells can be furthermore improved, and in addition, a reason that ON-resistance values can be reduced, such FETs having trench-gate structures without the so-called JFET effect could be conceived. A trench-gate structure is defined as follows: That is, while a conductive layer which will constitute a gate is formed via an insulating film in a trench which is elongated on a major surface of a semiconductor substrate, a deep layer portion of this major surface is employed as a drain region, a surface layer portion of the major surface is employed as a source region, and also a semiconductor layer between the drain region and the source region is used as a channel forming region. This sort of MISFET having the trench-gate structure is disclosed in, for instance, JP-A-8-23092.

Also, Inventors of the present invention could invent the technique capable of preventing the source offset by making the upper surface of the gate conductor layer of the trench-gate structure higher than the major surface of the semiconductor substrate. This technique is opened in JP-A-12-277531. Also, as to FETs having planar structures, JP-A-9-246550 discloses the technique capable of forming the very fine trench in such a manner that the side wall spacer formed on the gate electrode on the substrate is employed so as to exceed the processing limitations.

SUMMARY OF THE INVENTION

An object of the present invention is to provide such a semiconductor technique capable of reducing an area of a semiconductor chip.

Another object of the present invention is to provide a semiconductor technique capable of mitigating an adverse influence of thermal stress, while preventing lowering of an avalanche breakdown capability.

In the above-described conventional semiconductor devices, the insulating film is opened by way of the etching process with employment of the resist mask formed by way of the photolithography, so that the contact region with respect to the source region is exposed. As a consequence, in order to form the contact region, the margin of mask alignment involving dimension errors and errors of this mask alignment is required. This margin often restricts the occupied area of the FET unit cell. Thus, there is such a limitation that the ON-resistance value is lowered by reducing the unit cell area.

While the source region is connected to the source region, in such a case that the body contact for electrically connecting the source electrode by the contact hole is carried out also in the contact layer which is formed in the channel forming region so as to maintain the base potential at a constant potential, if the position of the contact hole is positionally shifted, then the distances between the trench gates and the source electrodes, which are located around the source electrode, are not unformly made. As a consequence, in the portion where the distance between the trench gate and the source electrode is long, the resistance value between the emitter and the base is increased, so that the feedback amount is increased, and thus, the bipolar transistor effect may easily occur. Such a stray bipolar transistor could lower the avalanche breakdown capability.

The present invention has been made to solve these problems, and therefore, has an object to provide such a technique capable of advantageously decreasing occupied areas of semiconductor chips.

A typical inventive idea of the present invention disclosed in the specification will now be simply summarized as follows:

An insulated-gate type semiconductor device, according to an aspect of the present invention, is featured by such an insulated-gate type semiconductor device in which a gate-purpose conductive layer is embedded into a trench which is formed in a semiconductor substrate, and a conductive layer for a source is provided on a major surface of the semiconductor substrate, wherein: a portion of a gate pillar which is constituted by both the conductive layer for the gate and a cap insulating film for capping an upper surface of the gate-purpose conductive layer is projected from the major surface of the semiconductor substrate; a side wall spacer is provided on a side wall of said projected portion of the gate pillar; and the conductive layer for the source is connected to a contact region of the major surface of the semiconductor substrate, which is defined by the side wall spacer.

Also, an insulated-gate type semiconductor device, according to another aspect of the present invention, is featured by such an insulated-gate type semiconductor device comprising: a first semiconductor region selectively formed in a semiconductor substrate; a second semiconductor region selectively formed in the first semiconductor region; a trench which is reached from a major surface of the second semiconductor region to the semiconductor substrate; and a conductive layer which is formed via an insulating film in the trench; wherein: a gate pillar which is constituted by the conductive layer and a cap insulating film for capping an upper surface of the conductive layer owns a pillar which is elongated on a major surface of the second semiconductor region; a side wall spacer is provided on a side wall of the pillar of the gate pillar; an electrode is connected to the second semiconductor region in a contact region which is defined by the side wall spacer; and the semiconductor substrate is used as a drain, the conductive layer is used as a gate, and the second semiconductor region is used as a source.

Also, an insulated-gate type semiconductor device, according to another aspect of the present invention, is featured by such an insulated-gate type semiconductor device comprising: a first conductivity type semiconductor main body; a second conductivity type first semiconductor region formed at a predetermined depth within one major surface of the semiconductor main body, the second conductivity type being opposite to the first conductivity type; a first conductivity type second semiconductor region formed at a predetermined depth within the first semiconductor region; a first trench which penetrates the first semiconductor region, and is reached from a major surface of the second semiconductor region to the semiconductor main body; a pillar gate which is constituted by both a gate-purpose conductive layer (for the gate) embedded via an insulating film into the first trench and a cap insulating film for capping an upper surface of the gate-purpose conductive layer, and a portion of which pillar gate having a pillar portion projected from the major surface of the second semiconductor region; and a first electrode which is electrically connected to the second semiconductor region in a region between a side wall spacer provided on a side wall of the pillar portion of the pillar gate, and the side wall spacer.

Also, an insulated-gate type semiconductor device, according to another aspect of the present invention, is featured by such an insulated-gate type semiconductor device having a longitudinal structure, comprising: a semiconductor main body indicative of a first conductivity type; a first semiconductor region indicative of a second conductivity type, which is formed in the semiconductor main body; a second semiconductor region indicative of the first conductivity type, which is formed in the first semiconductor region; and a trench gate which is reached from a major surface of the second semiconductor region to the region of the semiconductor main body; wherein: a portion of a gate pillar which is made of both the trench gate and an insulating film for covering an upper surface of the trench gate exceeds and is projected from the major surface of the second semiconductor region; a side wall spacer is provided on a side wall of the projected gate pillar; and a source electrode connected to the semiconductor region is provided on a contact region defined by the side wall spacer.

Also, an insulated-gate type semiconductor device, according to another aspect of the present invention, is featured by such a method for manufacturing an insulated-gate type semiconductor device in which a gate-purpose conductive layer is embedded into a trench which is formed in a semiconductor substrate, and a source-purpose conductive layer is provided on the major surface, comprising: a step for forming a first semiconductor region within the semiconductor substrate; a step for forming a trench in the semiconductor substrate in such a manner that the trench penetrates the first semiconductor forming region; a step for forming a gate insulating film on a surface of the first semiconductor region which is exposed within the trench; a step in which the trench where the gate insulating film is formed by a gate pillar made of both the gate-purpose conductive layer and a cap insulating film for capping an upper surface of the gate-purpose conductive layer, and a portion of the gate pillar is projected from the major surface of the semiconductor substrate; a step for forming a second semiconductor region within the first semiconductor region which is segmented by the trench; a step for forming a side wall spacer on both the projected conductive layer and an insulating film for covering an upper surface of the projected conductive layer; and a step for forming the source-purpose conductive layer in a source contact region defined by the side wall spacer.

In accordance with the present invention, either the source contact region or the source contact hole is formed by way of such a self-alignment technique, while the side wall spacer formed on the side surface of the gate pillar which is projected from the major surface of the semiconductor substrate is employed as the mask. As a result, the margin for the mask alignment is no longer required, so that the occupied area of the unit cell can be reduced. As a consequence, the size of the semiconductor chip can be reduced, or the ON-resistance value thereof can be lowered.

Also, since the distance between the side surface of the trench and either the contact or the body contact can be sufficiently shortened, it is possible to avoid lowering of the avalanche breakdown capability, which is caused by the stray bipolar transistor. As a consequence, the avalanche breakdown capability can be secured under stable condition, and the withstanding voltages of the normally available low-medium withstanding voltage products can be improved, so that the on-vehicle type power transistors can be manufactured on the same semiconductor chips in combination with other electronic components, although these on-vehicle type power transistors have been conventionally provided in the separate manner. As a result, the development TAT of these on-vehicle type power transistors can be shortened, so that the products can be marketed in earlier stages, and furthermore, the development cost thereof can be reduced.

The cap insulating film for caping the upper surface of the gate electrode can be formed with arbitrarily-selected thicknesses thereof by employing the deposited film by way of the CVD method, or the like. The width of the side wall spacer which covers the side walls of both the gate electrode and the cap insulating film can be formed as the arbitrarily-selected width by the film thickness of the silicon oxide film and the like, which are processed by the etching back operation. Since the side wall spacer is formed on the side surface of the gate pillar, the insulating film can be formed in a semi-circular shape, and also the intervals between the end portions of the gate electrodes and the source electrodes located around these gate electrodes can be made uniform. In addition, both the cap insulating film and the side wall spacer are made in an integral form by such a continuous plane where no stepped portion is formed. As a result, the adverse influence caused by the thermal stress can be reduced.

Next, effects which can be achieved by the typical embodiment modes of the present invention will now be simply explained as follows:

(1) According to the insulated-gate type semiconductor device of the present invention, there is such an effect that the source contact can be formed by way of the self-alignment manner with employment of the side wall spacer.

(2) In accordance with the present invention, since the above-described effect (1) can be obtained, another effect may be achieved. That is, the margin for the mask alignment purpose is no longer required, and also the occupied area of the unit cell can be reduced.

(3) In accordance with the present invention, since the above-described effect (2) can be obtained, another effect may be achieved. That is, the size of the semiconductor chip can be reduced, or the ON-resistance value can be lowered.

(4) In accordance with the present invention, since the above-described effect (1) can be obtained, another effect may be achieved. That is, the distance between the side surface of the trench and either the contact or the body contact can be sufficiently shortened.

(5) In accordance with the present invention, since the above-described effect (4) can be obtained, another effect may be achieved. That is, it is possible to avoid lowering of the avalanche breakdown capability, which is caused by the prarasitic (stray) bipolar transistor.

(6) In accordance with the present invention, since the side wall spacer is formed on the side surface of the gate pillar, the insulating film can be formed in a semi-circular shape, and also the intervals between the end portions of the gate electrodes and the source electrodes located around these gate electrodes can be made uniform. In addition, there is a further effect that both the cap insulating film and the side wall spacer are made in an integral form by such a continuous plane where no stepped portion is formed, so that the adverse influence caused by the thermal stress can be reduced.

The above-described objects and other novel features of the present invention may become apparent from a detailed description and the accompanying drawings.

DESCRIPTION OF THE EMBODIMENTS

Figure 1:
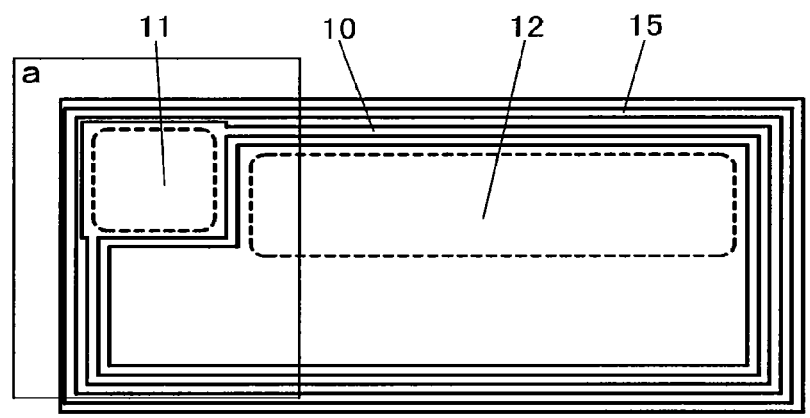
FIG. 1 is a plan view for showing a semiconductor device according to an embodiment of the present invention.

Referring now to drawings, various embodiments of the present invention will be described.

It should be understood that the same reference numerals will be employed as those for denoting the same, or similar functional elements in all of the relevant drawings used to explain various embodiment modes of the present invention, and explanations thereof are only made once.

Embodiment Mode 1

Figure 2:
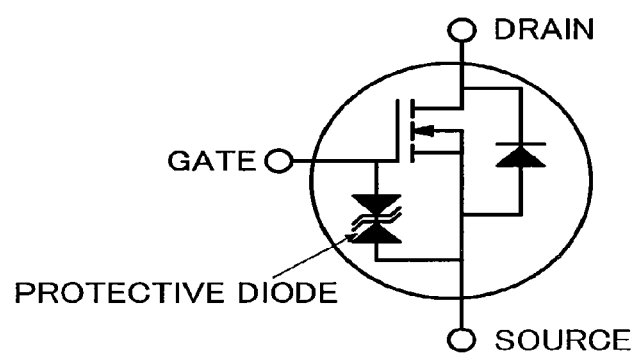
FIG. 2 is an equivalent circuit diagram of the semiconductor device according to the embodiment of the present invention.
Figure 3:
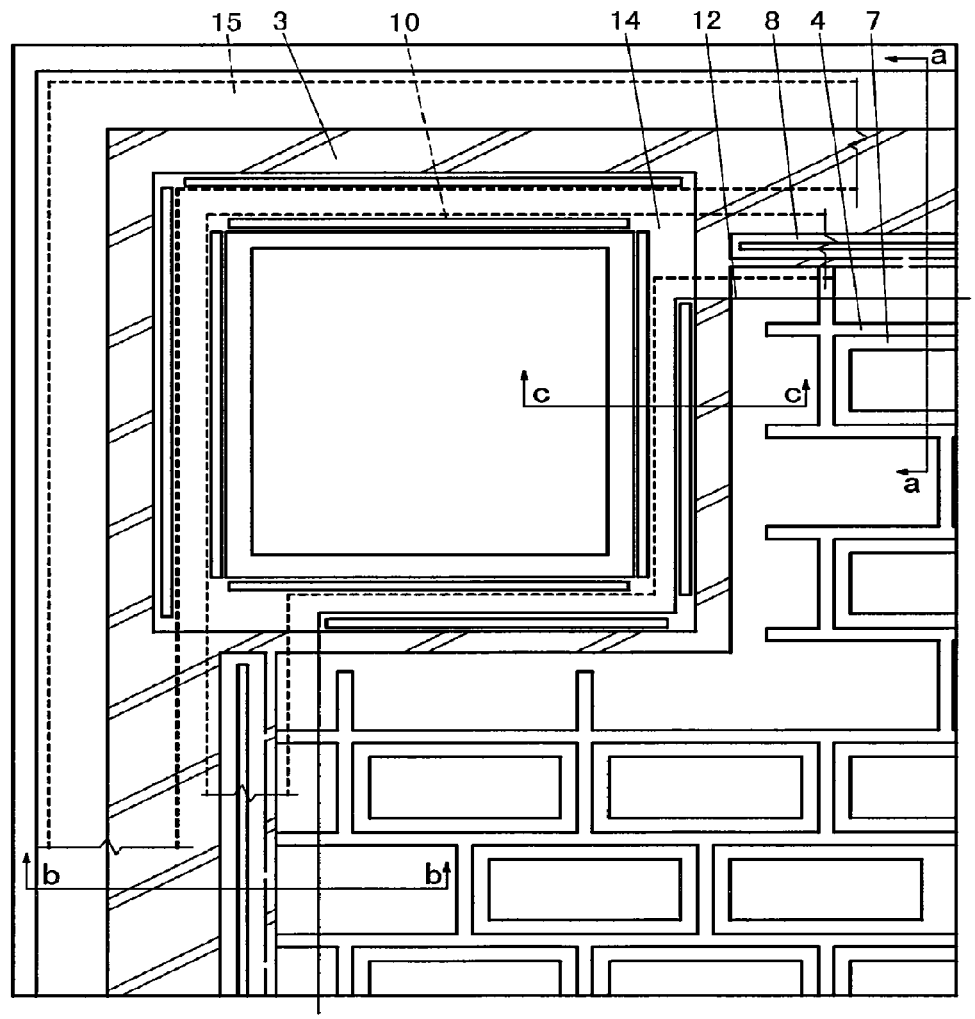
FIG. 3 is a plan view for partially indicating a major portion of the semiconductor device according to the embodiment of the present invention.
Figure 4:
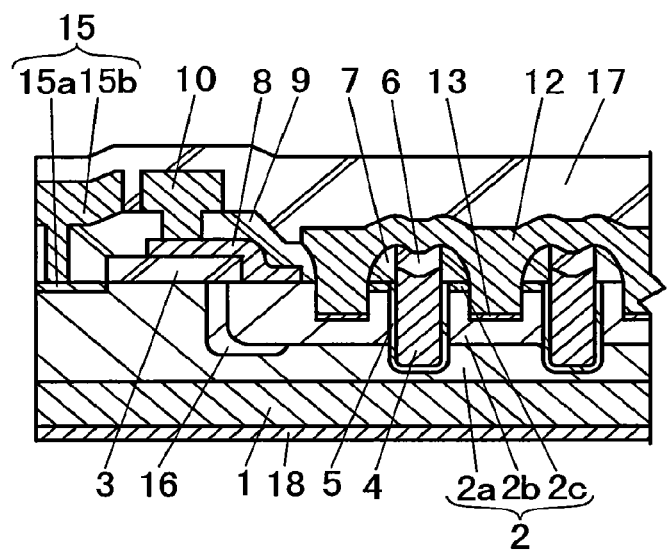
FIG. 4 is a longitudinal sectional view for showing the semiconductor device, taken along a line "a-a" of FIG. 3.
Figure 5:
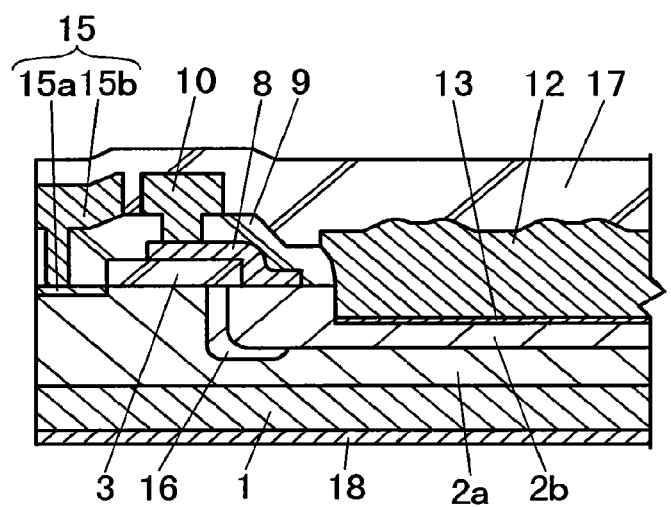
FIG. 5 is a longitudinal sectional view for showing the semiconductor device, taken along a line "b-b" of FIG. 3.
Figure 6:
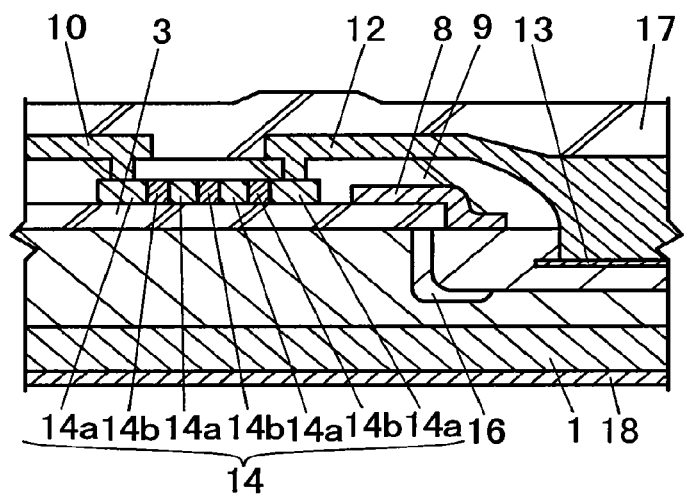
FIG. 6 is a longitudinal sectional view for showing the semiconductor device, taken along a line "c-c" of FIG. 3.

FIG. 1 is a plan view for representing a longitudinal type power MISFET having a trench-gate corresponding to a semiconductor device according to an embodiment mode 1 of the present invention. FIG. 2 is an equivalent circuit diagram for illustratively representing this power MISFET. FIG. 3 is a plan view of indicating a major portion "a" shown in FIG. 1, while this major portion "a" is enlarged. FIG. 4 is a longitudinal sectional view of the power MISFET, taken along a line "a" to "a" of FIG. 3. FIG. 5 is a longitudinal sectional diagram of the power MISFET, taken along a line "b" to "b" of FIG. 3. FIG. 6 is a longitudinal sectional diagram for representing the MISFET, taken along a line "c" to "c" of FIG. 3.

The MISFET of this embodiment mode 1 is manufactured on such a substrate that, for example, an epitaxial layer 2 is formed on an $n^+$ type semiconductor substrate made of monocrystal silicon. This MISFET is formed within a region which is surrounded by a plate-shaped field insulating film 3 (indicated by double hatched line also in FIG. 3), and contains a rectangular portion inside a corner portion. The plate-shaped field insulating film 3 is provided in a rectangular-shaped ring along an outer peripheral portion of the semiconductor substrate.

Within the above-described region, a plurality of cells having trench-gate structures are arranged in a regular manner. A plane shape of these cells is formed to be a rectangle. While the respective gates are arranged in a grid (lattice) shape, as viewed in the plane, the respective cells are connected to each other in a parallel manner by way of a mesh-gate structure.

Each of these cells constitutes a longitudinal FET manufactured by that an $n^-$ type first semiconductor layer $2a$ formed on the semiconductor substrate 1 constitutes a drain region, a p type second semiconductor layer 2b formed on the first semiconductor layer 2a constitutes a base region where a channel is formed, and an n+ type third semiconductor layer 2c formed on the second semiconductor layer 2b constitutes a source region.

A gate conductive layer 4 is formed via a gate insulating film 5 in a trench which is reached to the n− type first semiconductor layer 2a constituting the drain region from the major surface of the semiconductor substrate. As the gate conductive layer 4, for instance, polycrystal silicon into which an impurity has been conducted is employed, whereas as the gate insulating film 5, this film 5 is constituted by a multilayer film manufactured in such a manner that, for example, a thermal oxidation film having a thickness of on the order of 27 nm, and also a deposited film having a thickness of on the order of 50 nm are sequentially formed. While a shape of a cell is made rectangular, a side surface of each of the semiconductor layers 2a, 2b, and 2c is formed in either a stripe shape or a mesh shape on either a crystalline surface (100) or another plane equivalent to this crystalline surface (100) plane, so that carriers are moved along the above-described crystalline surface (100), or the plane equivalent to this crystalline surface (100) by an electric field of the gate conductive layer 4. As a result, mobility can be improved.

An upper surface of the gate conductive layer 4 according to this embodiment mode 1 is covered, or capped by a cap insulating film 6, and a gate pillar which is constructed of both the gate conductive layer 4 and the cap insulating film 6 is formed and located higher than the surface of the third semiconductor layer 2c which constitutes the source region, namely, higher than the major surface of the semiconductor substrate. A side wall spacer 7 is formed on a side wall of such a portion of the gate pillar, which is projected from the major surface of the semiconductor substrate. In this semiconductor structure, in the case that a portion of the gate conductor layer 4 is made higher than the major surface of the semiconductor substrate, even when the source region is made shallower, it is possible to avoid such a source offset that the gate conductor layer 4 is deviated from the source region. Alternatively, this semiconductor structure may be formed by that only the cap insulating film 6 is projected.

As indicated in FIG. 3, the gate conductive layers 4 of the cells which are located to each other are mutually connected with each other. The respective gate conductor layers 4 of such cells which are located on the outer peripheral portion are connected to a gate wiring line 8 using, for instance, polycrystal silicon in the vicinity of the outer peripheral portion of the semiconductor chip.

The gate wiring line 8 is formed via an interlayer insulating film 9 on an upper layer, and is electrically connected to a gate guard ring 10 (this gate guard ring being partially shown by broken line in FIG. 3) using, for instance, aluminum containing silicon. The gate guard ring 10 is formed with a rectangular-shaped gate electrode 11 in an integral manner. This rectangular-shaped gate electrode 11 is provided on a rectangular portion of a corner portion of the field insulating film 3, and is partially indicated by a broken line in FIG. 3. Also, a connection region (denoted by broken line shown in FIG. 1) of the gate conductive layer 4 is provided on the gate electrode 11.

A conductive layer 12 used for the source region is electrically connected to the third semiconductor layer 2c which constitutes the source region. This source-purpose conductive layer 12 employs, for example, aluminum containing silicon, and is partially indicated by a broken line in FIG. 3. The source-purpose conductive layer 12 is connected to a contact region (shown by broken line in FIG. 1) of the third semiconductor layer 2c which is defined by the side wall spacer 7. In order to maintain a base potential at a constant potential, this source-purpose conductive layer 12 is similarly and eclectically connected to a p+ type contact layer 13 which is provided in the second semiconductor layer 2b in addition to the third semiconductor layer 2c which constitutes the source region.

Also, as indicated in FIG. 2, FIG. 3, or FIG. 6, a protective diode 14 having a back-to-back structure is provided between the gate electrode 11 and the source-purpose conductive layer 12, and this protective diode 14 may prevent the gate insulating film 5 from being brought into a breakdown state with respect to surge energy applied from the source. FIG. 6 is a longitudinal sectional view for showing the protective diode 14, while enlarging this protective diode 14. The protective diode 14 is constructed in such a manner that N+ type semiconductor regions 14a and p type semiconductor regions 14b are alternatively formed in a coaxial ring shape, and both the gate electrode 11 and the source-purpose conductive layer 12 are electrically connected to the n+ type semiconductor regions 14a located on both ends, respectively.

Also, a source guard ring 15 is provided at the outer peripheral portion of the field insulating film 3. In this source guard ring 15, a wiring line 15b (this wiring line is partially indicated by broken line in FIG. 3) using, for instance, aluminum containing silicon is connected to an n+ type semiconductor region 15a which is formed on the major surface of the semiconductor substrate. Similar to the source-purpose conductive layer 12, this wiring line 15b of the source guard ring 15 is connected to the n+ type semiconductor region 14a of the protective diode 14.

It should also be noted that both the gate wiring line 6 and the gate guard ring 10 are formed on the field insulating film 3 which is formed in the rectangular ring shape, and both the gate electrode 11 and the protective diode 14 are formed on the rectangular portion provided at the corner portion of the field insulating film 3.

Also, along the field insulating film 3 formed in the rectangular ring shape, a p type well 16 is formed in a lower portion of this field insulating film 3. Since a termination portion of the gate conductive layer 4 is connected via the gate insulating film 5 to this p type well 16, a depletion layer which is present under the field insulating film 3 is gently extended in order to avoid the discontinuity of this depletion layer. As a consequence the p type well 16 may function as an electric field relaxing portion capable of relaxing an electric field of the termination portion of the gate conductive layer 4.

A protective insulating film 17 is formed on an entire surface of the major surface of the semiconductor substrate, while this protective insulating film 17 covers the gate guard ring 8, the gate electrode 9, the source-purpose conductive layer 12, and the source guard ring 15. The protective insulating film 17 employs both a silicon oxide film and polyimide, and is manufactured by way of such a plasma CVD method, for instance, while tetraethoxysilane (TEOS) gas is employed as a subject of source gas. An opening is formed in this protective insulating film 17, and this opening may partially expose both gate electrode 9 and the source-region conductive layer 12. Then, both the gate electrode 9 and the source-purpose conductive layer 12, which are exposed via this opening, may constitute a connection region for both a gate and a source, to which electric connections are carried out by a wire bonding manner, and the like.

As a connection region as a drain, a drain electrode 18 which is conducted to the n+ type semiconductor substrate 1 is formed on an entire surface of a rear surface of the semiconductor substrate in the form of either a metal layer or a stacked film layer. This metal layer is formed in such a manner that for example, nickel, titanium, nickel, and silver are sequentially stacked. The stacked layer is formed in such a manner that titanium, nickel, and gold are sequentially stacked. The surface of this drain electrode 18 using either silver or gold is connected to a lead frame by way of, for example, an adhesive material having a conductive characteristic, so that electric connections may be carried out.

Referring now to FIG. 7 to FIG. 16, a description is made of a method for manufacturing the above-described semiconductor device.

First, an n⁻ type epitaxial layer 2 having a thickness of on the order of 5 μm is formed by employing an epitaxial growth on an n⁺ type semiconductor substrate 1 made of monocrystalline silicon into which arsenic (As) is conducted. The concentration of this n⁻ type epitaxial layer 2 is lower than that of the semiconductor substrate 1. As a result, such a semiconductor substrate which is constituted by both the semiconductor substrate 1 and the epitaxial layer 2 is prepared. Subsequently, an silicon oxide film having a thickness of on the order of 600 nm is formed on a major surface of this semiconductor substrate by way of, for example, a thermal oxidation method. A mask is formed on this silicon oxide film by way of a photolithography. A plate-shaped field insulating film 3 is formed in a rectangular ring shape along an outer peripheral portion of the semiconductor substrate, while this plate-shaped field insulating film 3 owns a rectangular portion inside a corner portion thereof. Thereafter, a mask is formed by way of the photolithography along an inner peripheral portion of this field insulating film 3. While ions of, for instance, boron (B) is implanted by using this mask so as to diffuse he conducted impurity, a p type well 16 is formed which may constitute an electric field relaxing portion. It should also be noted that impurity concentration of the p type well 16 is made equal to, or lower than, for example, the impurity concentration of the second semiconductor layer 2b.

Figure 7:
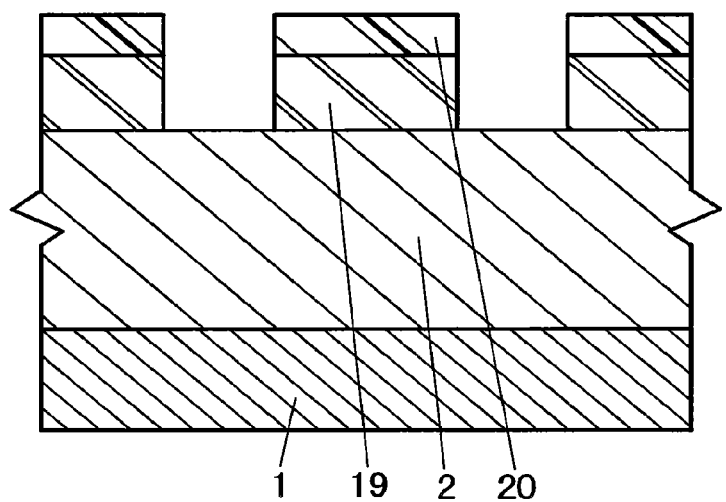
FIG. 7 is a longitudinal sectional view for representing a major portion of the semiconductor device at each manufacturing step, according to the embodiment of the present invention.

Subsequently, an insulating film 19 having a relatively thick thickness is formed on the major surface of the semiconductor substrate. A thermal oxide film having a thickness of 40 nm, polycrystal silicon (i-poly Si) having a thickness of 600 nm and containing no impurity, and a silicon oxide film having thickness of 500 nm are stacked. A resist mask 20 is formed by way of the photolithography on the insulating film 19 within a cell forming region which is surrounded by the field insulating film 3. This resist mask 20 opens a pattern of a gate conductive layer 4 having a mesh-gate structure in which the respective gates are arranged in a lattice (grid) form in the two-dimensional manner. Another opening is formed in the insulating film 19 by executing an etching method, while this resist mask 20 is employed. This opening may expose the major surface of the semiconductor substrate of the above-explained pattern. FIG. 7 represents a portion of the gate conductive layer under this condition, while this layer portion is enlarged.

Figure 8:
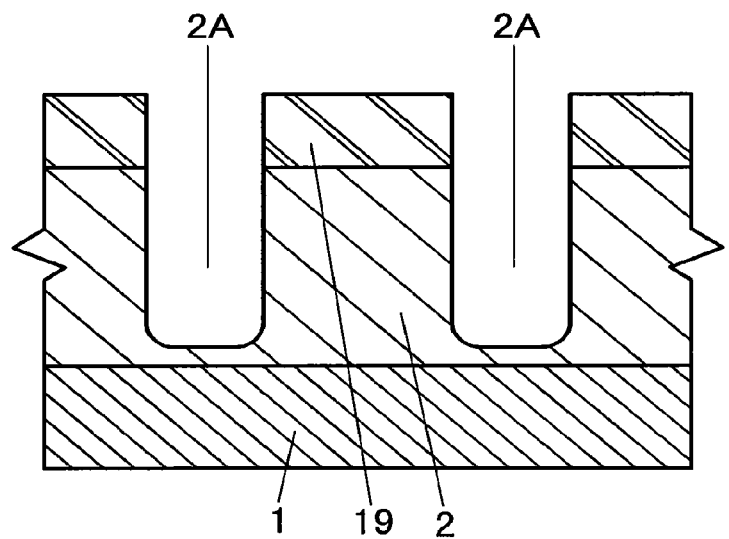
FIG. 8 is a longitudinal sectional view for indicating a major portion of the semiconductor device at each manufacturing step, according to the embodiment of the present invention.
Figure 9:
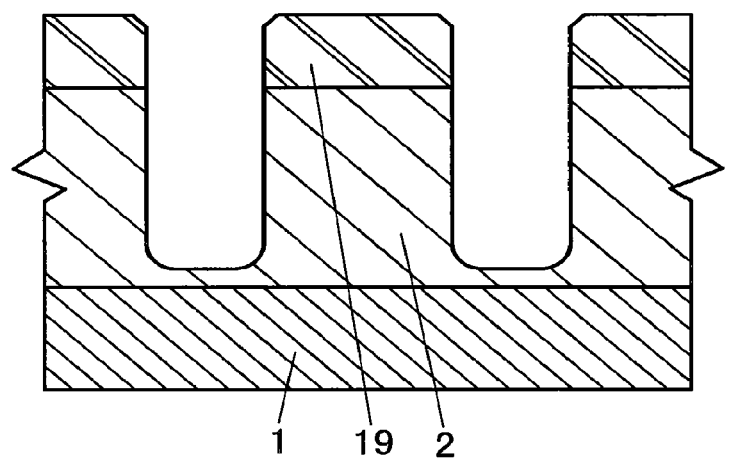
FIG. 9 is a longitudinal sectional view for representing a major portion of the semiconductor device at each manufacturing step, according to the embodiment of the present invention.

Next, while the insulating film 19 in which the opening is formed is employed as a mask, a trench (namely, trench 2A) having a depth of, for example, on the order of 1.6 μm is formed in the major surface of the semiconductor substrate by way of a dry etching process. This condition is indicated in FIG. 8. It should also be noted that since this etching process is performed by executing an isotropic etching process by a wet etching process at first, and by executing an anisotropic etching process by a dry etching process, both a bottom surface of the trench and a corner portion of an edge potion thereof are relaxed which are formed as indicated in FIG. 9.

Next, a gate insulating film 5 is formed in which a silicon oxide film having a thickness of 50 nm is stacked on a thermal oxide film having a thickness of 27 nm by way of a CVD (Chemical Vapor Deposition) method. A polycrystal silicon film 4' which constitutes a conductive film of the gate conductive layer 4 is formed on an entire surface of the major surface of the semiconductor substrate including the inside of he above-explained trench by way of the CVD method. The formation of this polycrystal silicon film 4' is subdivided into two stages, while being carried out. For instance, a polycrystal silicon film having a thickness of 300 nm is formed at the first stage, whereas a polycrystal silicon film having a thickness of 300 nm is formed at the second stage. Thereafter, an anealing process operation is carried out at the temperature of approximately 950° C. and for a time duration of approximately 10 minutes. Since the above-described film depositions by the two stages are carried out, such a gate conductive layer having no cavity is formed within the trench. An impurity (for example, phosphorus) capable of reducing a resistance value is conducted into this polycrystal silicon film 4' either during deposition thereof, or after this deposition. The concentration of this impurity is selected to be 1 E18/cm³ to 1 E21/cm³. This state is indicated in FIG. 10.

Figure 10:
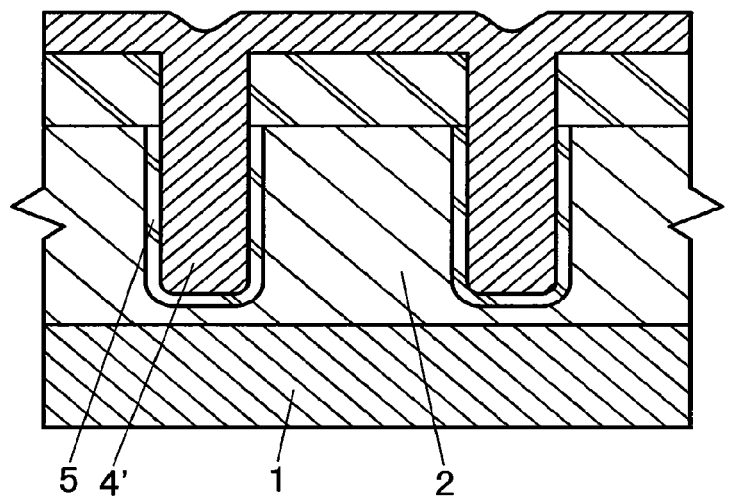
FIG. 10 is a longitudinal sectional view for indicating a major portion of the semiconductor device at each manufacturing step, according to the embodiment of the present invention.
Figure 11:
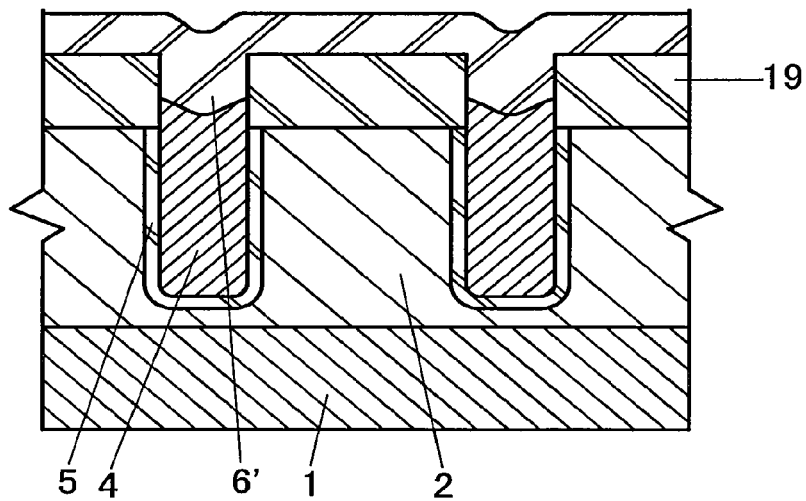
FIG. 11 is a longitudinal sectional view for representing a major portion of the semiconductor device at each manufacturing step, according to the embodiment of the present invention.

Subsequently, the polycrystal silicon film 4' shown in FIG. 10 is etched back. This etching-back operation of the polycrystal silicon film 4' carried out at such a degree that an upper edge of the polycrystal silicon film 4' is left within the opening portion of the insulating film 19. The gate conductive layer 4 is formed within the above-explained trench, and then, a silicon oxide film 6' is deposited on an entire surface in this manner. This state is shown in FIG. 11.

Figure 12:
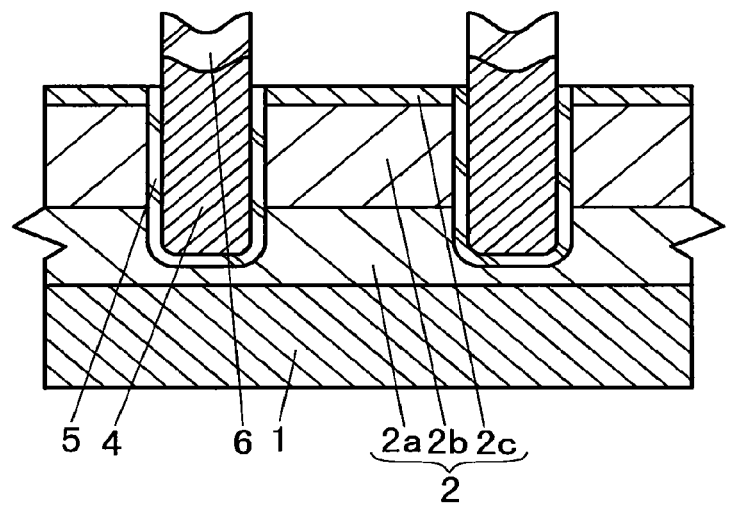
FIG. 12 is a longitudinal sectional view for indicating a major portion of the semiconductor device at each manufacturing step, according to the embodiment of the present invention.

Next, the silicon oxide film 6' is etched so as to be removed, so that a cap insulating film 6 is formed, and this cap insulating film 6 caps an upper surface of the gate conductive layer 4. Since the silicon oxide film of the insulating film 19 is made thin by executing this etching process operation, the polycrystal silicon of the insulating film 19 is removed by utilizing a difference in an etching selective ratio of the silicon oxide and the polycrystal silicon; a gate pillar made of both the gate conductor layer 4 and the cap insulating film 6 is projected from the major surface of the semiconductor substrate in a pillar form; while this gate pillar is employed as a mask, ions of a p type imparity (for example, boron) are implanted into an entire surface of the epitaxial layer 2; and a diffusion process operation (first thermal process operation) is carried out for a time duration of approximately 100 minutes within such a nitrogen gas atmosphere (at temperature of on the order of ° C.) containing 1% $O_2$, so that a p type second semiconductor layer 2b is formed, and constitutes a channel forming region. Subsequently, ions of an n type impurity (for example, arsenic) are selectively implanted; and an annealing process operation (second thermal process operation) is carried out for a time duration of approximately 30 minutes within such a nitrogen gas atmosphere (at temperature of on the order of 950° C.) containing 1% $O_2$, so that a third semiconductor layer 2c is formed and constitutes a source region. Then, a deep portion of the epitaxial layer 2, into which these impurities are not conducted, may constitute a first semiconductor layer 2a functioning as a drain region. Concretely speaking, this deep portion corresponds to such an epitaxial layer 2 which is located between the second semiconductor layer 2b and the semiconductor substrate 1. This state is indicated in FIG. 12.

Figure 13:
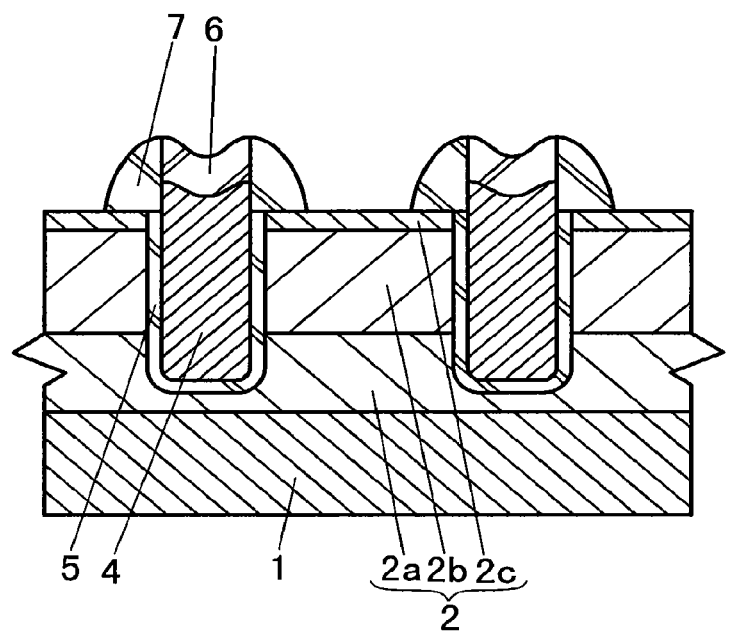
FIG. 13 is a longitudinal sectional view for representing a major portion of the semiconductor device at each manufacturing step, according to the embodiment of the present invention.

Next, a silicon oxide film is deposited on an entire surface of the resulting semiconductor substrate, and then is removed by performing an etching process so as to form a side wall spacer 7 on a side surface of the above-explained gate pillar. This state is indicated in FIG. 13.

Figure 14:
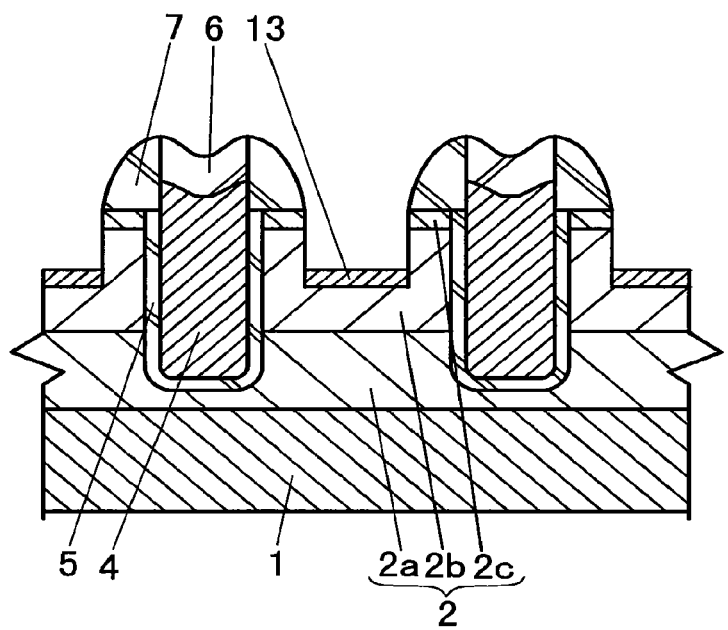
FIG. 14 is a longitudinal sectional view for indicating a major portion of the semiconductor device at each manufacturing step, according to the embodiment of the present invention.

Next, while the side wall spacer 7 is employed as a mask, an etching process is carried out so as to form a contact hole. Then, a p type impurity such as boron is directly conducted into such a second semiconductor layer 2b which is exposed by the contact hole, so that a p type contact layer 13 is formed. This state is represented in FIG. 14.

Figure 15:
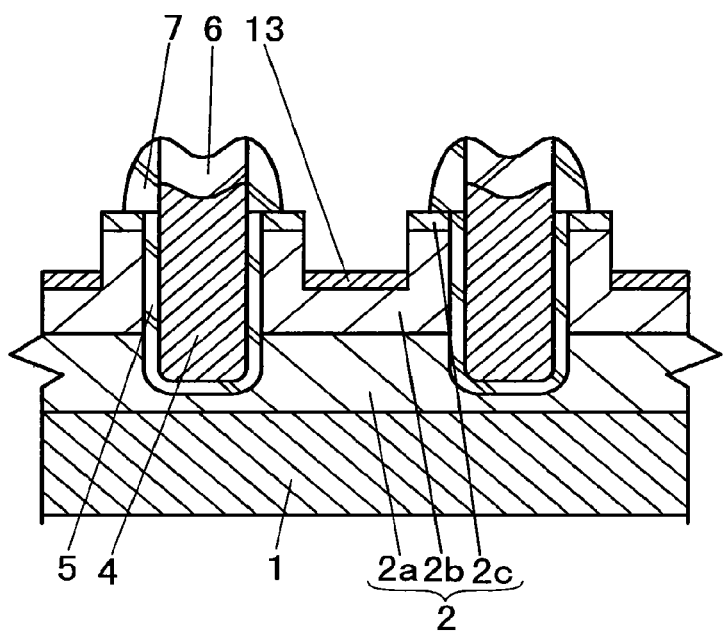
FIG. 15 is a longitudinal sectional view for representing a major portion of the semiconductor device at each manufacturing step, according to the embodiment of the present invention.

Also, after the contact hole has been formed, as shown in FIG. 15, an etching process is carried out in such a manner that the silicon oxide of the side wall spacer 7 is selectively removed with respect to the silicon of the major surface of the semiconductor substrate, so that the side wall spacer 7 is moved along a backward direction, and the surface of the third semiconductor layer 2c is exposed with respect to the contact hole in a self-alignment manner. As a result, a contact area between the third semiconductor layer 2c and the source-region conductive layer 12 is enlarged, so that a contact resistance value may be reduced.

Figure 16:
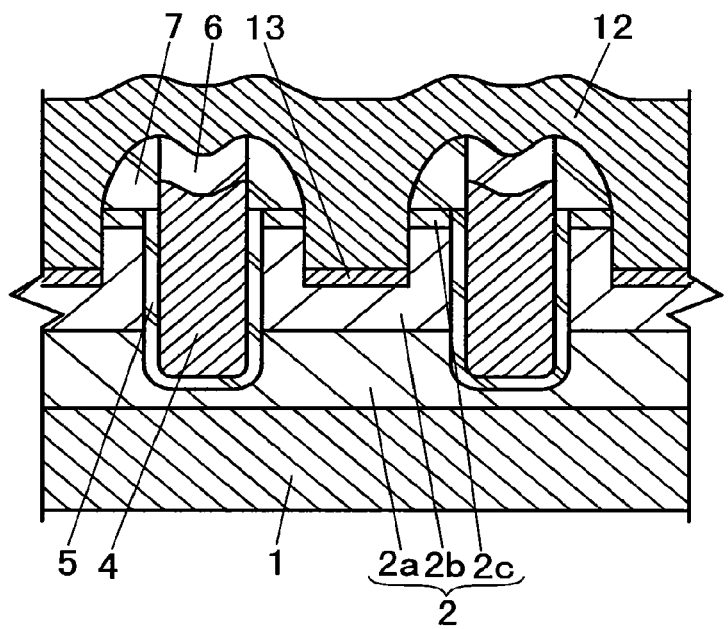
FIG. 16 is a longitudinal sectional view for indicating a major portion of the semiconductor device at each manufacturing step, according to the embodiment of the present invention.

Next, a conductive film (metal film) made of, for instance, aluminium containing silicon is formed on an entire surface on the major surface of the semiconductor substrate containing the inside portion of the contact hole, and this metal film is patterned in order to form a gate guard ring 10, a gate electrode 11, a source-purpose conductive layer 12, and a source guard ring 15. This state is shown in FIG. 16.

Next, polyimide is coated and stacked on a silicon oxide film by performing a plasma CVD method with employment of, for example, tetraethosysilane (TEOS) gas functioning as a subject of source gas, so that a protective insulating film 17 is formed, and this protective insulating film 17 covers an entire surface of the major surface of the semiconductor substrate. An opening is formed in this protective insulating film 17, and this opening is used to expose the above-described connection region between the gate electrode 11 and the source-region conductor layer 12; a polishing process operation is carried out with respect to rear surface of the n$^+$ type semiconductor substrate 1; and then, a drain electrode 18 is formed on this rear surface by way of, for example, a vapor deposition manner, which constitutes such a conduction shown in FIG. 4.

Embodiment Mode 2

A semiconductor manufacturing method according to an embodiment mode 2 of the present invention owns only such a different technical method from that of the above-described embodiment mode 1, namely a method of forming a cap insulating film 6. However, other manufacturing methods of this embodiment mode 2 are substratially identical to those of the embodiment mode 1.

The method for manufacturing the semiconductor device according to the embodiment mode 2 will now be explained with reference to FIG. 7 to FIG. 10, and FIG. 17 to FIG. 20.

Figure 17:
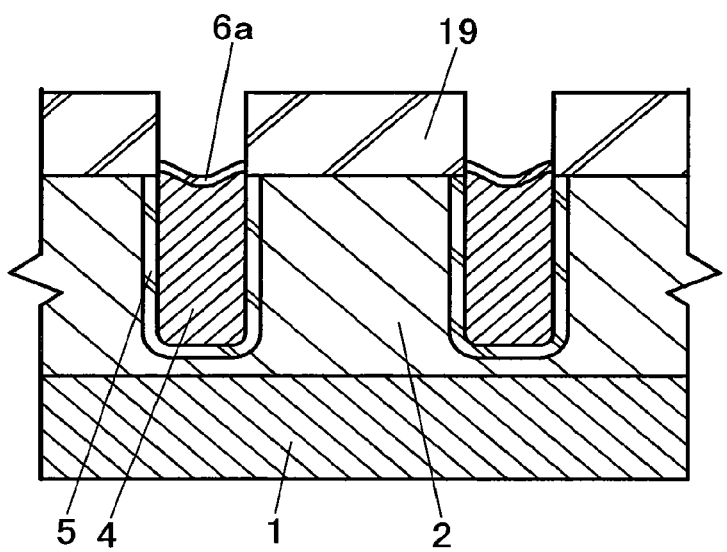
FIG. 17 is a longitudinal sectional view for showing a major portion of a semiconductor device according to another embodiment of the present invention.

First, as indicated in FIG. 7, an insulating film 19 having a relatively thick thickness and made of a silicon oxide film having a thickness of 900 nm is formed on a major surface of a semiconductor substrate. A resist mask 20 is formed by way of the photolithography on the insulating film 19 within a cell forming region which is surrounded by a field insulating film 3. This resist mask 20 opens a pattern of a gate conductive layer 4 having a mesh-gate structure in which the respective gates are arranged in a lattice (grid) form in the two-dimensional manner. Another opening is formed in the insulating film 19 by executing an etching method, while this resist mask 20 is employed. Then, similar to the above-described embodiment mode 1, as indicated in FIG. 8 and FIG. 9, while the insulating film 19 in which the opening is formed is employed as a mask, a trench 2A having a depth of, for example, on the order of 1.6 μm is formed in the major surface of the semiconductor substrate by way of a dry etching process. Next, a gate insulating film 5 is formed in which a silicon oxide film having a thickness of 50 nm is stacked on a thermal oxide film having a thickness of 27 nm by way of a CVD (Chemical Vapor Deposition) method on the surface within the trench 2A. A polycrystal silicon film 4' is deposited on an entire surface of the major surface of the semiconductor substrate including the inside of the above-explained trench, as indicated in FIG. 10. Then, this polycrystal silicon film 4' is removed by executing an etching process, a gate conductive layer 4 is formed within this trench, and this polycrystal silicon film 4' is etched back, so that the gate conductive layer 4 is formed inside the above-described trench, and a silicon oxide film 6a is formed on an upper surface of this gate conductive layer 4 by way of a thermal oxidation. This state is indicated in FIG. 17.

Figure 18:
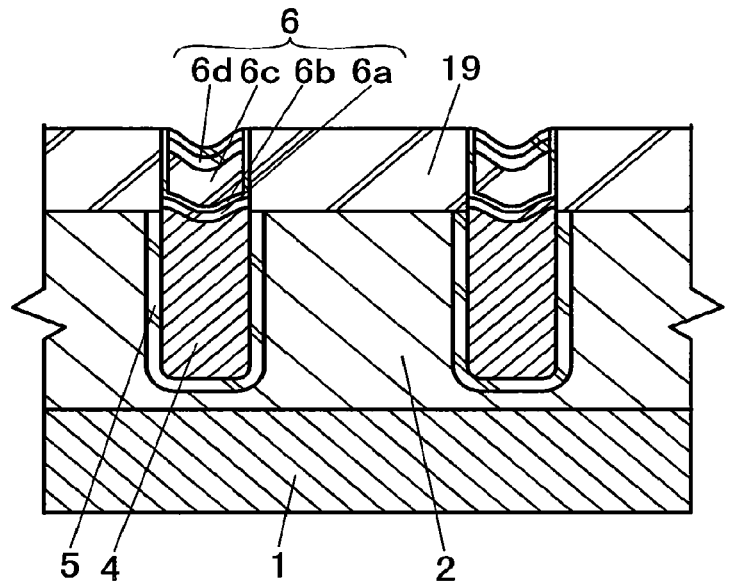
FIG. 18 is a longitudinal sectional view for indicating a major portion of the semiconductor device according to the embodiment of the present invention.

Next, a silicon nitride film 6b having a thickness of on the order of 50 nm is deposited on an entire surface containing an upper surface of the silicon oxide film 6a, and furthermore, the silicon oxide film 6c which is deposited on the silicon oxide film 6b is removed by way of an etching process, so that the silicon oxide film 6c is embedded within the trench. Thereafter, a non-doped polycrystal silicon film 6d which has been deposited over the entire surface is removed by way of an etching process operation, so that the polycrystal silicon film 6d is embedded into the trench. This state is indicated in FIG. 18.

Next, while utilizing an etching selective ratio of the silicon nitride film 6b to the polycrystal silicon film 6d, the insulating film 19 is selectively removed; a gate pillar made of both the gate conductor layer 4 and the cap insulating film 6 is projected from the major surface of the semiconductor substrate in a pillar form; while this gate pillar is employed as a mask, ions of a p type impurity (for example, boron) are implanted into an entire surface of the epitaxial layer 2; and a diffusion process operation (first thermal process operation) is carried out for a time duration of approximately 100 minutes within such a nitrogen gas atmosphere (at temperature of about 1100° C.) containing 1% $O_2$, so that a p type second semiconductor layer 2b is formed, and constitutes a channel forming region. Subsequently, ions of an n type impurity (for example, arsenic) are selectively implanted; and an annealing process operation (second thermal process operation) is carried out for a time duration of approximately 30 minutes within such a nitrogen gas atmosphere (at temperature of on the order of 950° C.) containing 1% $O_2$, so that a p type second semiconductor layer 2b is formed, and constitutes a channel forming region. Subsequently, ions of an n type impurity (for instance, arsenic) are selectively implanted; and an annealing process operation (second thermal process operation) is carried out for a time duration of approximately 30 minutes within such a nitrogen gas atmosphere (at temperature of on the order of 950° C.) containing 1% $O_2$, so that a third semiconductor layer 2c is formed and constitutes a source region.

Figure 19:
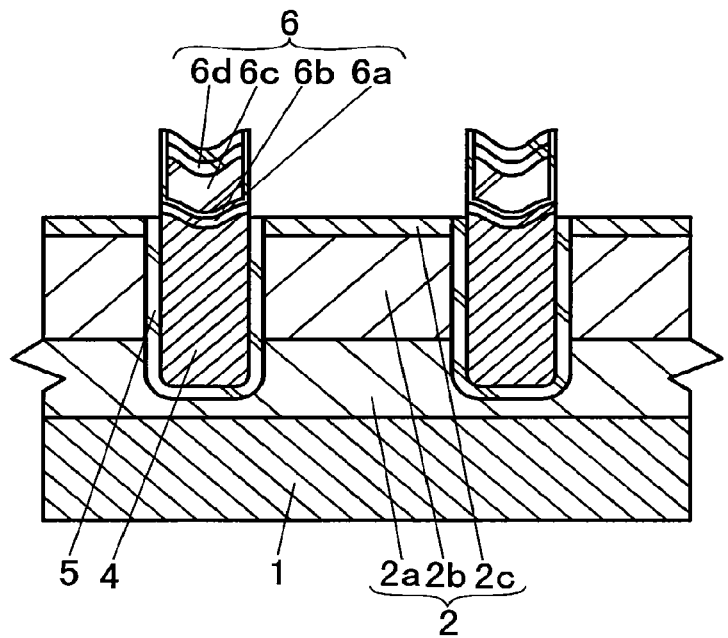
FIG. 19 is a longitudinal sectional view for showing a major portion of a semiconductor device according to another embodiment of the present invention.

Then, a deep portion of the epitaxial layer 2, into which these impurities are not conducted, may constitute a first semiconductor layer 2a functioning as a drain region. Concretely speaking, this deep portion corresponds to such an epitaxial layer 2 which is located between the second semiconductor layer 2b and the semiconductor substrate 1. This state is indicated in FIG. 19.

Figure 20:
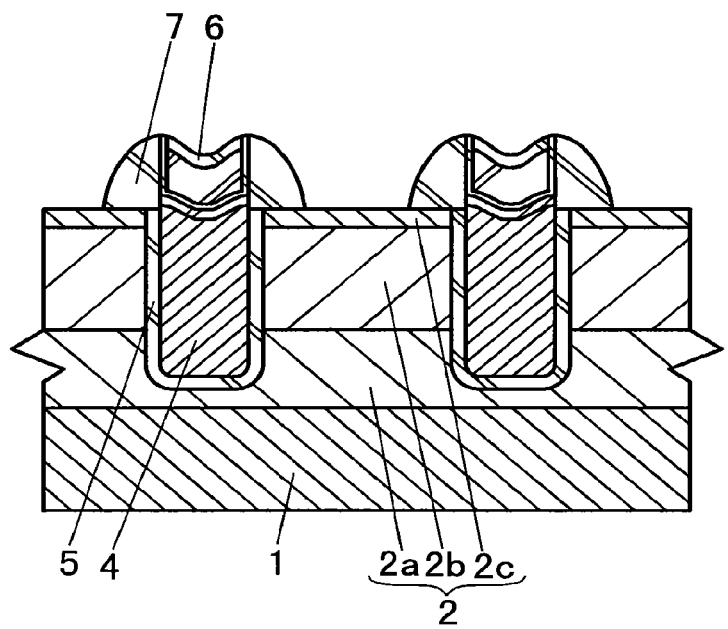
FIG. 20 is a longitudinal sectional view for indicating a major portion of the semiconductor device according to the embodiment of the present invention.

Next, a silicon oxide film is deposited on an entire surface of the resulting semiconductor substrate, and then is removed by performing an etching process so as to form a side wall spacer 7 on a side surface of the above-explained gate pillar. This state is indicated in FIG. 20. The steps subsequent to this step are similar to those of the above-explained embodiment mode 1. In accordance with this embodiment mode 2, since the thickness of the silicon nitride film 6b which may constitute the etching stopper is thin, a thickness of such a silicon nitride film which is formed on the rear surface can be made thinner. As a result, there is such an effect that stress of the rear surface can be relaxed.

Embodiment Mode 3

Figure 21:
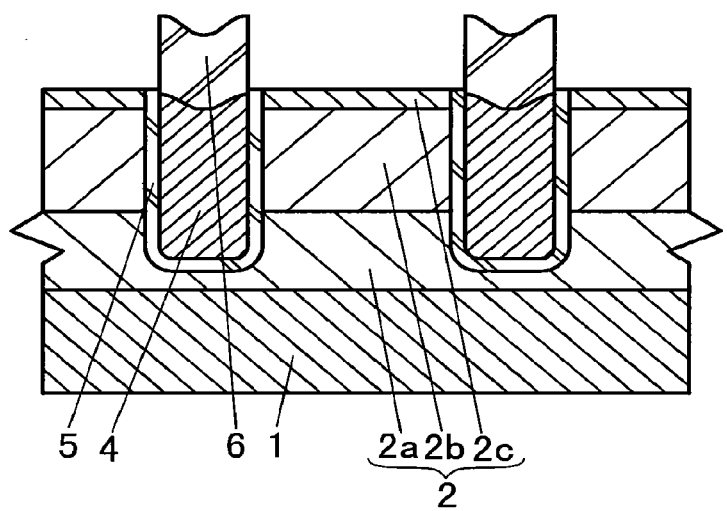
FIG. 21 is a longitudinal sectional view for showing a major portion of a semiconductor device according to a further embodiment of the present invention.

FIG. 21 is a longitudinal sectional view for indicating a modification of the above-explained gate pillar structure in the embodiment mode 1. In this modified gate pillar structure, an upper end of a gate conductive layer 4 is located lower than a major surface of a semiconductor substrate, but a portion of a cap insulating film 6 is made higher than the major surface of the semiconductor substrate. Structures of this semiconductor device other than this modified gate pillar structure are similar to those shown in the embodiment mode 1.

In accordance with the structure of this embodiment mode 3, since a thickness of the cap insulation film 6 is made thick, electric insulating characteristics between the gate and the source can be sufficiently secured. It should also be understood that a specific care should be taken to the following aspect. That is to say, the gate conductive layer 4 made in contact with the gate insulating film 5 is not brought into the offset state with respect to the source region 2c.

While the present invention has been described in detail based upon the above-explained embodiment modes, the present invention is not limited to these embodiment modes, but may be modified, changed, and substituted without departing from the technical scope and spirit of the present invention.

For instance, the inventive idea of the present invention may be applied not only to power MISFETs, but also to IGBTx (Integrated Gate Bipolar Transistors) and the like.

What is claimed is:

1. A method of manufacturing a semiconductor device including an IGBT, comprising the steps of:
   (a) providing a semiconductor substrate of a first conductivity type;
   (b) forming a first trench in the semiconductor substrate;
   (c) embedding a first conductive film in the first trench;
   (d) forming a first impurity region of a second conductivity type opposite the first conductivity type in the semiconductor substrate, wherein a depth of the first impurity region is shallower than a depth of the first trench;
   (e) forming a second impurity region of the first conductivity type in the semiconductor substrate, wherein a depth of the second impurity region is shallower than the depth of the first impurity region;
   (f) forming a first insulating film over the second impurity region;
   (g) forming a second trench by using the first insulating film as a mask in the semiconductor substrate, wherein the second trench penetrates the second impurity region and reaches the first semiconductor impurity region, and wherein a depth of the second trench is shallower than a depth of the first trench;
   (h) forming a third impurity region of the second conductivity type in the first impurity region located at a bottom of the second trench, wherein an impurity concentration of the third impurity region is higher than an impurity concentration of the first impurity region;
   (i) after step (h), recessing the first insulating film, thereby a portion of a surface of the second impurity region is exposed; and
   (j) after step (i), forming a first metal film in the second trench, wherein the first metal film is electrically connected with the exposed surface of the second impurity region outside of the second trench and is electrically connected with the first, second, and third impurity regions inside of the second trench.

2. A method of manufacturing a semiconductor device according to claim 1,
   wherein a cap film is formed over a top surface of the first conductive film.

3. A method of manufacturing a semiconductor device according to claim 1,
   wherein the first conductive film includes a poly-silicon film.

4. A method of manufacturing a semiconductor device according to claim 1,
   wherein the first insulating film includes a silicon oxide film.

5. A method of manufacturing a semiconductor device according to claim 1,
   wherein the first metal film includes an aluminum.

6. A method of manufacturing a semiconductor device according to claim 1,
   wherein the first conductivity type is an n-type, and wherein the second conductivity type is a p-type.

* * * * *